United States Patent
Omi

(10) Patent No.: US 8,378,396 B2
(45) Date of Patent: Feb. 19, 2013

(54) PHOTOELECTRIC CONVERSION DEVICE AND IMAGE SENSOR USING THE SAME

(75) Inventor: Toshihiko Omi, Chiba (JP)

(73) Assignee: Seiko Instruments Inc. (JP)

( * ) Notice: Subject to any disclaimer, the term of this patent is extended or adjusted under 35 U.S.C. 154(b) by 1463 days.

(21) Appl. No.: 11/262,331

(22) Filed: Oct. 28, 2005

(65) Prior Publication Data

US 2007/0097455 A1    May 3, 2007

(51) Int. Cl.
*H01L 31/101* (2006.01)
(52) U.S. Cl. ............ 257/290; 257/E27.133
(58) Field of Classification Search .......... 257/290–294, 257/461–462, E27.133–E27.134
See application file for complete search history.

(56) References Cited

U.S. PATENT DOCUMENTS

| | | | | |
|---|---|---|---|---|
| 5,600,173 A * | 2/1997 | Suzunaga, Hiroshi | ....... | 257/446 |
| 7,151,287 B1 * | 12/2006 | Scheffer et al. | ............ | 257/292 |
| 7,235,831 B2 * | 6/2007 | Kozuka et al. | ............ | 257/292 |
| 2004/0000681 A1 * | 1/2004 | Shinohara et al. | ............ | 257/290 |
| 2004/0046194 A1 * | 3/2004 | Kozuka et al. | ............ | 257/292 |
| 2005/0035421 A1 * | 2/2005 | Kayanuma et al. | ........... | 257/432 |

* cited by examiner

*Primary Examiner* — Matthew W Such
*Assistant Examiner* — Ali Naraghi
(74) *Attorney, Agent, or Firm* — Adams & Wilks

(57) ABSTRACT

A photoelectric conversion device has pixel comprised of a first semiconductor region of a first conductivity type and a second semiconductor region of a second conductivity type disposed in the first semiconductor region. A first diffusion region of the first conductivity type is held at a predetermined potential, covers entirely the first semiconductor region, and covers only a part of an upper portion of the second semiconductor region. A second diffusion region of the second conductivity type covers a part of the upper portion of the second semiconductor region except for the part of the upper portion of the second semiconductor region covered by the first diffusion region. A thick oxide film covers entirely the first diffusion region and covers the upper portion of the second semiconductor region except for the part of the upper portion of the second semiconductor region covered by the second diffusion region.

24 Claims, 1 Drawing Sheet

PHOTOELECTRIC CONVERSION DEVICE AND IMAGE SENSOR USING THE SAME

BACKGROUND OF THE INVENTION

1. Field of the Invention

The present invention relates to a photoelectric conversion device and an image sensor using the same, and more particularly to a photoelectric conversion device used in an image input system such as an image scanner, a facsimile, a copying machine, or a composite printer obtained by combining these devices.

2. Description of the Related Art

Photoelectric conversion devices have been used widely for image input systems as described above. The photoelectric conversion devices can be divided into two classes, CCD and CMOS, based on difference in procedure of transmitting an input signal from a pixel to an output terminal.

In general, CCDs have been widely applied to image input systems compared with CMOS devices because of high SN ratio. A CCD photoelectric conversion device, however, requires plural power sources and consumes large power. Further, manufacturing cost for a CCD photoelectric conversion device is high compared with a CMOS photoelectric conversion device since its manufacturing method is different from general LSI manufacturing method. On the other hand, a CMOS photoelectric conversion device has such advantages that it can operate on a single power source the same for a general LSI, it consumes small power, and low cost manufacturing can be done since the LSI manufacturing method can be applied to.

In recent years, also regarding a random noise level, which has been considered higher than that of a CCD's, a high SN ratio close to that of a CCD's is achieved by the use of the technique disclosed in, for example, JP 09-205588 A. Further, a close contact image sensor of real scale system, to which plural IC chips having plural photoelectric conversion devices are mounted, is generally used as a CMOS image sensor. A close contact image sensor has been widely used in recent years since the sensor enables reduction in size and thickness of the image input system.

The reduction in size and thickness of the image input system, however, causes a problem in that noise which is radiated from a device such as a scanner, a facsimile, a copying machine, or a composite printer obtained by combining those devices, particularly, low-frequency 50 Hz/60 Hz noise which is radiated from a power source line, enters into a pixel of a photoelectric conversion device. In addition particularly in the case of the close contact image sensor, since a photoelectric conversion device is located immediately below a document platen on which a document is placed, there is also a problem in that noise from a human body enters a pixel when a hand is placed on the document platen. When the above-described external radiated noise enters a pixel of the photoelectric conversion device, the external noise is added to the photo-generated carriers, which are generated by incident light, and, as a result, an image output is affected by the noise. Accordingly, this is a serious problem.

SUMMARY OF THE INVENTION

The present invention has been made for solving the above problems, and therefore has an object to provide a photoelectric conversion device not influenced by external noise and an image sensor including the photoelectric conversion device.

According to the present invention, there is provided a photoelectric conversion device, including a pixel which is constituted by: a first semiconductor region of a first conductivity type; a second semiconductor region of a second conductivity type in the first semiconductor region; a first diffusion region of the first conductivity type on the second semiconductor region; and a second diffusion region of the second conductivity type in the second semiconductor region and in which an upper portion of the second semiconductor region is covered by a thick oxide film except a part of the upper portion which is covered by the second diffusion region, in which the first diffusion region is held at a predetermined potential.

In this case, the second semiconductor region is in a floating state and accumulates photo-generated carriers.

According to the present invention, the first diffusion region, which is held at the predetermined potential, is arranged on the second semiconductor region in which the photogenerated carriers for input signal are accumulated. The first diffusion region has therefore a function of a shielding an upper portion of the pixel, and is able to prevent external noise from entering the second semiconductor region in which the photogenerated carriers for input signal are accumulated.

Here, the second diffusion region has a higher impurity concentration than that of the second semiconductor region; and the second semiconductor region is electrically connected to a circuit element outside the pixel through the second diffusion region.

The circuit element comprises a MOS transistor.

The thick oxide film which covers an upper portion of the second region can be an oxide film formed by the same step as to form a field oxide film on a field region that electrically separates adjacent MOS transistors.

The first diffusion region can be a diffusion region formed by the same step as to form a field diffusion region, which is formed in a semiconductor substrate, in a field region which electrically separates adjacent MOS transistors.

Further, the second diffusion region is surrounded by the first diffusion region, and in contact with the first diffusion region or can be formed in an isolated island shape.

The first diffusion region is electrically connected with the first semiconductor region, and is held at a potential equal to that of the first semiconductor region. Alternatively, the first diffusion region is not electrically connected with the first semiconductor region, and has a terminal, which holds the first diffusion region at an arbitrary potential, and a wiring. More alternatively, the first diffusion region has a circuit element, which generates a reference voltage for holding the first diffusion region at an arbitrary potential, and a wiring, thus a predetermined potential can be held.

Further, incorporating the photoelectric conversion device according to the present invention into a casing that integrally accommodates: a mounting substrate for mounting the photoelectric conversion device; a light source for irradiating light to a document; and an imaging lens for imaging reflected light or scattered light from the document irradiated with the light source at the photoelectric conversion device, an image sensor can thus be obtained.

In this case, in order to obtain a close contact type image sensor, it is sufficient to have as many photoelectric conversion devices as to obtain a necessary document size arranged in line on the mounting substrate

DESCRIPTION OF THE PREFERRED EMBODIMENTS

Figure 1:
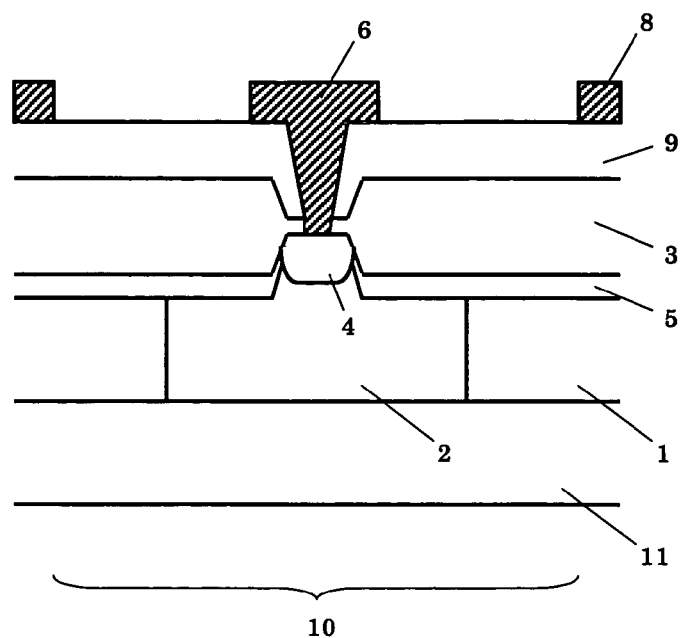
FIG. 1 is a view of a sectional structure of a pixel of a photoelectric conversion device in accordance with a first embodiment of the present invention.
Figure 2:
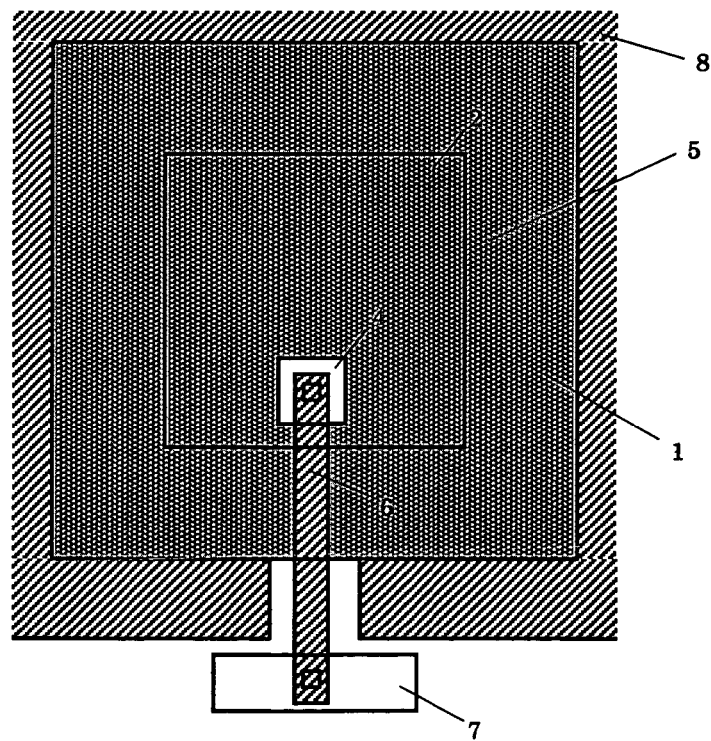
FIG. 2 is a view of a plane structure of the pixel of the photoelectric conversion device in accordance with the first embodiment of the present invention.

Hereinafter, description will be made of an embodiment of the present invention with reference to the drawings.
First Embodiment FIGS. 1 and 2 show a view of a sectional structure of a pixel 10 of a photoelectric conversion device and a view of a plane structure thereof according to the present invention. FIG. 1 shows the sectional structure taken along an A-A' line of FIG. 2.

In the photoelectric conversion device of this embodiment, a P-well 1 and an n-type PD well 2 are formed in a P-type silicon substrate 11. In this embodiment, the P-type silicon substrate 11 and the P-well 1 correspond to a first semiconductor region, and the PD well 2 corresponds to a second semiconductor region. A field oxide film 3 is formed above the P-well 1 and the n-type PD well 2. An N+ region 4 as a second diffusion region is formed in the n-type PD well 2, and no field oxide film is formed only on the N+ region 4. A P± region 5 serving as a first diffusion region is formed immediately below the field oxide film 3.

Photogenerated carriers generated by incident light are accumulated in the PD well 2, and a signal is transmitted to a circuit element 7 outside the pixel from the N+ region 4 through an aluminum wiring 6. Periphery of the pixel 10 is surrounded by a light shielding aluminum 8. A BPSG film 9 serving as an intermediate film is formed under the aluminum wiring 6 and the light shielding aluminum 8.

The P-type region 5 is electrically connected with the P-well 1 or the P-type silicon substrate 11. Since the potential of the P-type silicon substrate 11 is held at Vss, the potential of the P-type region 5 is always held at Vss also. The PD well 2 is surrounded by the P-type region 5, the P-well, and the P-type silicon substrate 11 except its portion surrounded by the N+ region 4. Noise radiated from the outside, therefore, does not reach the PD well 2 which accumulates photogenerated carriers.

Further, the thick field oxide film 3 is formed above the PD well 2. Generally, when light passes a uniform transparent film, interference of the light reflected in the transparent film affects the intensity of the passing light. Regarding the influence of the interference, the thinner the transparent film is, the greater the variance in the intensity of the passing light becomes with respect to the thickness or a wavelength of a light source. Consequently, it is more preferable that the oxide film above the pixel is thicker. In this embodiment, the upper portion of the pixel 10 except the N+ region 4 is covered by the thick field oxide film 3, which realizes a structure that is not easily affected by light interference.

Further, the p-well 1, field oxide film 3, N+ region 4, P-type region 5, aluminum wiring 6, light shielding aluminum 8, and BPSG film 9, which constitute the pixel, are formed by the same step as to manufacture a MOS transistor that constitutes the circuit element 7 outside the pixel. Accordingly, the pixel 10 in the photoelectric conversion device of this embodiment is formed by a process obtained by only adding a step of forming the PD well 2 to a general CMOS-LSI manufacturing step.

In this embodiment, the step of forming the PD well 2 is added to the general LSI manufacturing step so as to attain a predetermined impurity concentration of the PD well 2. The PD well 2 can, however, be formed by the same step as an N-well step, which is one of the steps of manufacturing the MOS transistor that constitutes the circuit element 7 outside the pixel. In this case, completely the same manufacturing step as a general CMOS-LSI manufacturing step can be adopted.

Moreover, in this embodiment, the first conductivity type and the second conductivity type are the P-type and the N-type, respectively. However, there is no problem when the first conductivity type and the second conductivity type are the N-type and the P-type, respectively.

According to the present invention, a photoelectric conversion device can be provided which is not influenced by noise radiated from an image input system device such as a scanner or a facsimile, particularly, external noise with low frequency which is radiated from a power source line or human body. Further, a photoelectric conversion device of the present invention involves a little influence of the light interference which affects the incident light in the photoelectric conversion device. Since the method of manufacturing the photoelectric conversion device is the same as the general LSI manufacturing method, the photoelectric conversion device can be manufactured at low cost.

Furthermore, using a photoelectric conversion device of the present invention can provide an image sensor, which enables high quality reading of an image.

What is claimed is:

1. A photoelectric conversion device comprising: a pixel comprised of a first semiconductor region of a first conductivity type, a second semiconductor region of a second conductivity type disposed in the first semiconductor region, a first diffusion region of the first conductivity type held at a predetermined potential and covering entirely the first semiconductor region and covering only a part of an upper portion of the second semiconductor region, a second diffusion region of the second conductivity type disposed above the second semiconductor region and the first diffusion region and covering a part of the upper portion of the second semiconductor region except for the part of the upper portion of the second semiconductor region covered by the first diffusion region, and a field oxide film having a thick portion and a thin portion, the thick portion of the field oxide film covering the upper portion of the second semiconductor region except for a portion of the part of the upper portion of the second semiconductor region covered by the second diffusion region, the first diffusion region being disposed entirely under the thick portion of the field oxide film, and the thin portion of the field oxide film being disposed directly in contact with the second diffusion region but not the first semiconductor region, second semiconductor region and first diffusion region.

2. A photoelectric conversion device according to claim 1; wherein the second semiconductor region is in a floating state and accumulates photogenerated carriers.

3. A photoelectric conversion device according to claim 1; wherein the second diffusion region has a higher impurity concentration than that of the second semiconductor region; and wherein the second semiconductor region is configured for electrical connection to a circuit element external to the pixel through the second diffusion region.

4. A photoelectric conversion device according to claim 3; wherein the circuit element comprises a MOS transistor.

5. A photoelectric conversion device according to claim 1; wherein the second diffusion region is surrounded by and is disposed in direct contact with the first diffusion region.

6. A photoelectric conversion device according to claim 1; wherein the first diffusion region is electrically connected with the first semiconductor region and is held at a potential equal to that of the first semiconductor region.

7. A photoelectric conversion device according to claim 1; wherein the first diffusion region is electrically connected with the first semiconductor region and has a terminal that holds the first diffusion region at an arbitrary potential.

8. A photoelectric conversion device according to claim 1; wherein the first diffusion region is electrically connected to the first semiconductor region and has a circuit element that generates a reference voltage for holding the first diffusion region at an arbitrary potential.

9. A photoelectric conversion device according to claim 1; wherein the field oxide film is a single field oxide film with the thick portion thereof directly covering the upper portion of the second semiconductor region with only the first diffusion region disposed therebetween.

10. A photoelectric conversion device according to claim 1; further comprising a metal wiring extending through the thin portion of the field oxide film so as to be in direct contact with the second diffusion region.

11. An image sensor comprising:
   at least one photoelectric conversion device comprising a pixel made of a first semiconductor region of a first conductivity type, a second semiconductor region of a second conductivity type disposed in the first semiconductor region, a first diffusion region of the first conductivity type held at a predetermined potential and covering entirely the first semiconductor region and covering only a part of an upper portion of the second semiconductor region, a second diffusion region of the second conductivity type disposed above the second semiconductor region and the first diffusion region and covering a part of the upper portion of the second semiconductor region except for the part of the upper portion of the second semiconductor region covered by the first diffusion region, and a field oxide film having a thick portion and a thin portion, the thick portion of the field oxide film covering the upper portion of the second semiconductor region except for a portion of the part of the upper portion of the second semiconductor region covered by the second diffusion region, the first diffusion region being disposed entirely under the thick portion of the field oxide film, and the thin portion of the field oxide film being disposed directly in contact with the second diffusion region but not the first semiconductor region, second semiconductor region and first diffusion region;
   a mounting substrate on which the photoelectric conversion device is mounted;
   a light source for irradiating light to a document;
   an imaging lens for imaging at the photoelectric conversion device reflected light or scattered light from the document resulting from the light irradiated to the document by the light source; and
   a casing for integrally holding the mounting substrate, the light source, and the imaging lens.

12. An image sensor according to claim 11; wherein the at least one photoelectric conversion device comprises a plurality of photoelectric conversion devices arranged in line on the mounting substrate.

13. An image sensor according to claim 11; wherein the field oxide film is a single field oxide film with the thick portion thereof directly covering the upper portion of the second semiconductor region with only the first diffusion region disposed therebetween.

14. An image sensor according to claim 11; further comprising a metal wiring extending through the thin portion of the field oxide film so as to be in direct contact with the second diffusion region.

15. A photoelectric conversion device comprising: a pixel comprised of a first semiconductor region of a first conductivity type, a second semiconductor region of a second conductivity type surrounded by the first semiconductor region, a first diffusion region of the first conductivity type held at a predetermined potential and covering entirely the first semiconductor region and covering only a part of an upper portion of the second semiconductor region, a second diffusion region of the second conductivity type disposed above the second semiconductor region and the first diffusion region and covering a part of the upper portion of the second semiconductor region except for the part of the upper portion of the second semiconductor region covered by the first diffusion region, and a field oxide film having a thin portion and a thick portion, the thin portion of the field oxide film being disposed directly in contact with the second diffusion region but not the first semiconductor region, second semiconductor region and first diffusion region, and the first diffusion region being disposed entirely under the thick portion of the field oxide film.

16. A photoelectric conversion device according to claim 15; wherein the second diffusion region covers a part of an upper portion of the second semiconductor region; and wherein the thick portion of the field oxide film covers the upper portion of the second semiconductor region except for the part of the upper portion of the second semiconductor region covered by the second diffusion region.

17. A photoelectric conversion device according to claim 15; wherein the second diffusion region is disposed in direct contact with the first diffusion region.

18. A photoelectric conversion device according to claim 15; wherein the first diffusion region is electrically connected with the first semiconductor region and is held at a potential equal to that of the first semiconductor region.

19. A photoelectric conversion device according to claim 15; wherein the first diffusion region is electrically connected with the first semiconductor region and has a terminal that holds the first diffusion region at an arbitrary potential.

20. A photoelectric conversion device according to claim 15; wherein the first diffusion region is electrically connected to the first semiconductor region and has a circuit element that generates a reference voltage for holding the first diffusion region at an arbitrary potential.

21. An image sensor comprising:
   at least one photoelectric conversion device according to claim 15;
   a mounting substrate on which the photoelectric conversion device is mounted;
   a light source for irradiating light to a document;
   an imaging lens for imaging at the photoelectric conversion device reflected light or scattered light from the document resulting from the light irradiated to the document by the light source; and
   a casing for integrally holding the mounting substrate, the light source, and the imaging lens.

22. An image sensor according to claim 21; wherein the at least one photoelectric conversion device comprises a plurality of photoelectric conversion devices arranged in line on the mounting substrate.

23. A photoelectric conversion device according to claim 15; wherein the field oxide film is a single field oxide film with the thick portion thereof directly covering the upper portion of the second semiconductor region with only the first diffusion region disposed therebetween.

24. A photoelectric conversion device according to claim 15; further comprising a metal wiring extending through the thin portion of the field oxide film so as to be in direct contact with the second diffusion region.

* * * * *